(12) United States Patent
Wolf et al.

(10) Patent No.: US 11,064,602 B1
(45) Date of Patent: Jul. 13, 2021

(54) CIRCUIT BOARD INTERCONNECT SYSTEM AND METHOD FOR AN ARRAY ANTENNA

(71) Applicant: Rockwell Collins, Inc., Cedar Rapids, IA (US)

(72) Inventors: Jeremiah D. Wolf, Atkins, IA (US); Matilda G. Livadaru, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 405 days.

(21) Appl. No.: 16/147,447

(22) Filed: Sep. 28, 2018

(51) Int. Cl.
| | |
|---|---|
| *H01Q 1/38* | (2006.01) |
| *H05K 1/02* | (2006.01) |
| *H01Q 1/50* | (2006.01) |
| *H05K 1/14* | (2006.01) |
| *H05K 1/11* | (2006.01) |
| *H01Q 3/24* | (2006.01) |
| *H05K 3/36* | (2006.01) |

(52) U.S. Cl.
CPC ............. *H05K 1/0251* (2013.01); *H01Q 1/38* (2013.01); *H01Q 1/50* (2013.01); *H01Q 3/24* (2013.01); *H05K 1/115* (2013.01); *H05K 1/144* (2013.01); *H05K 3/368* (2013.01); *H05K 2201/041* (2013.01); *H05K 2201/10098* (2013.01)

(58) Field of Classification Search
CPC ............... H01Q 1/38; H01Q 1/50; H01Q 3/24
See application file for complete search history.

(56) References Cited

U.S. PATENT DOCUMENTS 9,070,977 B2 * 6/2015 Choudhury .............. H01Q 1/38

* cited by examiner

*Primary Examiner* — Graham P Smith
(74) *Attorney, Agent, or Firm* — Suiter Swantz pc llo

(57) ABSTRACT

An antenna system includes a first printed circuit board having an array of printed circuit board antenna elements, a second circuit board having a signal distribution network for the antenna elements, and at least one first interconnect structure coupled between a bottom surface of the first printed circuit board and a top surface of the second circuit board. The first interconnect structure can include first vias having an aspect ratio of greater than 10 to 1. The vias electrically connect to respective first contacts on the bottom surface of the first circuit board and to respective second contacts on the top surface of the second circuit board.

18 Claims, 4 Drawing Sheets

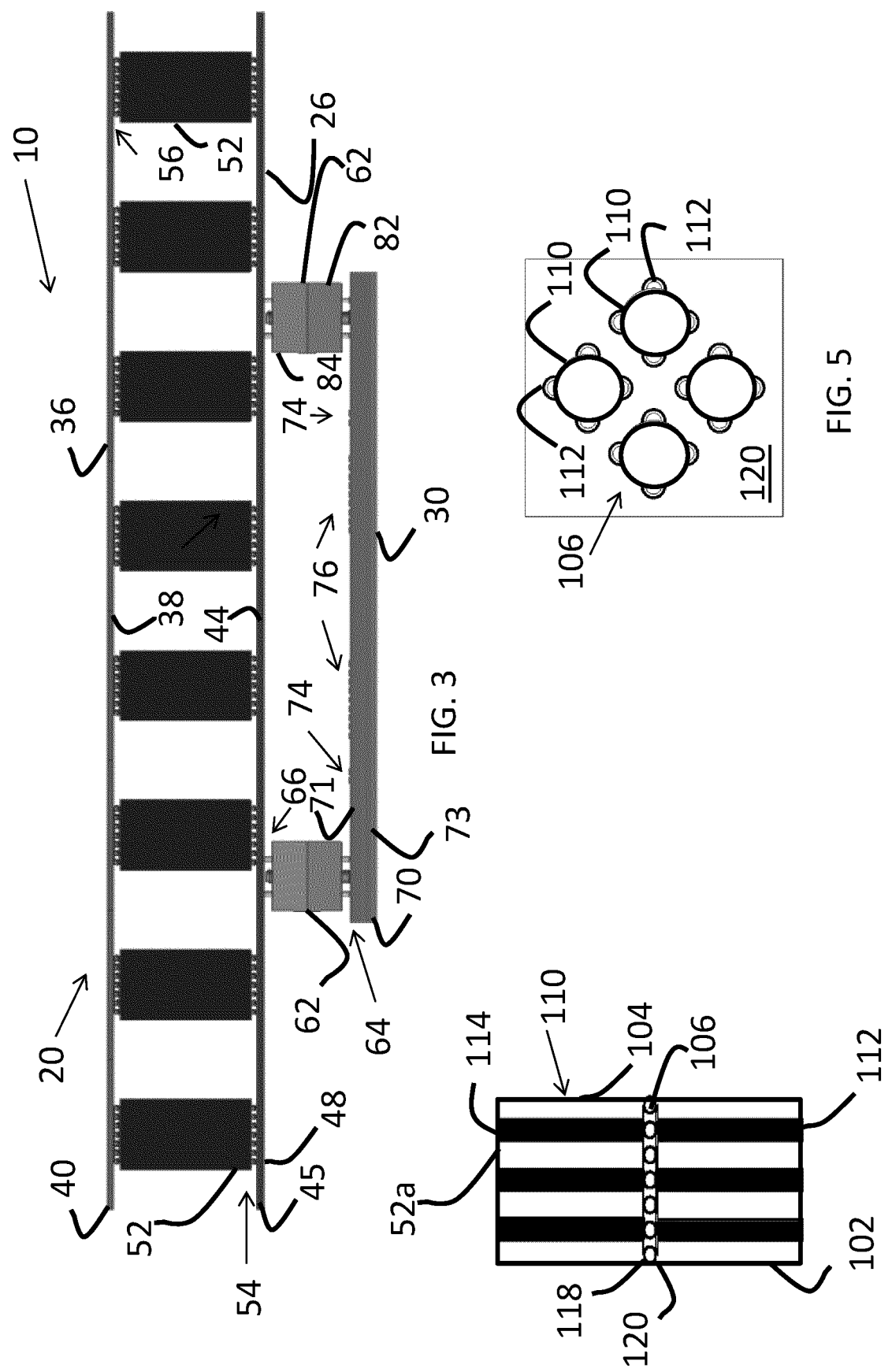

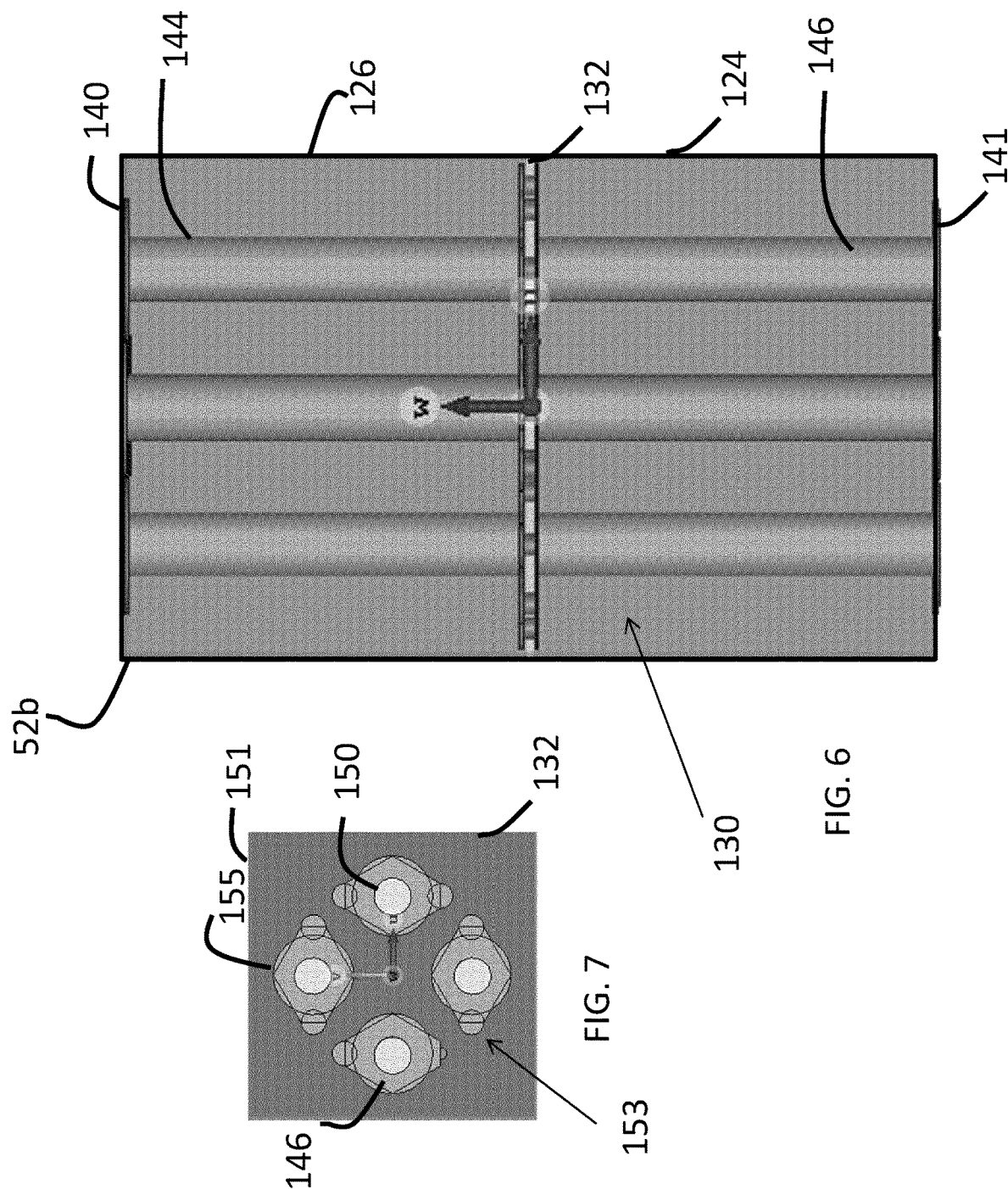

CIRCUIT BOARD INTERCONNECT SYSTEM AND METHOD FOR AN ARRAY ANTENNA

BACKGROUND

Embodiments of inventive concepts disclosed herein relate generally to the field of antenna systems. More specifically, the present disclosure relates generally to the field of interconnects for antenna arrays, including but not limited to, connectorless interconnects for phased array antenna systems or electronically scanned array (ESA) antenna systems, such as active electronically scanned array (AESA) antenna systems.

Antenna arrays are utilized with transceivers for sensing and communication applications. The antenna array can be electronically steered by using a beam former with variable phase shifters or time delay units coupled to respective antenna elements in the antenna array to direct the antenna at a pointing angle. The antenna array is coupled to the transceiver through an interconnect to the phase shifters or time delay units as well as components, such as, apertures, power amplifiers, low noise amplifiers, transmit/receive switches, temperature sensing equipment, combiners, connectors, signal lines, powerlines, ground lines, etc. An ultra-wide band (UWB) or ultra UWB (UUWB) antenna array often includes a ground plane that can limit the bandwidth of those arrays in low profile installations. In certain conventional systems, the antenna array is spaced apart from the ground plane using connector-based interfaces or edge mounted cards which can add to the size, weight, complexity and cost of the communication system.

It would be desirable to provide a system and/or method that provides one or more advantageous features (e.g., less size, weight, complexity, or cost). Other features and advantages will be made apparent from the present specification. The teachings disclosed extend to those embodiments that fall within the scope of the appended claims, regardless of whether they accomplish one or more of the aforementioned needs.

SUMMARY

In one aspect, embodiments of the inventive concepts disclosed herein are directed a circuit board interconnect system for an array antenna which is disposed on a first printed circuit board having printed circuit board antenna elements. The circuit board interconnect system includes a second circuit board having a signal distribution network for the antenna elements, and at least one first interconnect structure coupled between a bottom surface of the first printed circuit board and a top surface of the second circuit board. The first interconnect structure includes first vias having an aspect ratio of greater than 10 to 1. The vias electrically connect to respective first contacts on the bottom surface of the first circuit board and to respective second contacts on the top surface of the second circuit board.

In a further aspect, embodiments of the inventive concepts disclosed herein are directed to a method of assembling an antenna system. The method includes providing a first printed circuit board having an array of printed circuit board antenna elements, providing a second circuit board having a signal distribution network for the antenna elements, and providing at least one first interconnect structure having first contacts on a first planar top surface and second contacts on a second planar first bottom surface. The method also includes coupling the first contacts to a bottom surface of the first printed circuit board, and coupling the second contacts to a top surface of the second circuit board. Vias electrically connect the first contacts and the second contacts.

In a further aspect, embodiments of the inventive concepts disclosed herein are directed to an antenna system. The antenna system includes a first printed circuit board having an array of printed circuit board antenna elements disposed on a first planar top surface, a second circuit board having a second planar top surface disposed in parallel with the first planar top surface, and at least one first interconnect feed structure coupled between a first bottom surface of the first printed circuit board and the second top surface of the second circuit board. The first interconnect structure includes two or more layers of circuit boards. The first interconnect structure comprises first contacts disposed on a third planar top surface and second contacts disposed on a fourth planar bottom planar surface. The first contacts are electrically connected to the first bottom surface and the second contacts are electrically connected to the second top surface. Vias disposed between the third top surface and the third bottom surface connect the first contacts and the second contacts.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or maybe represented schematically in the interest of clarity. Like reference numerals in the drawings may represent and refer to the same or similar element, feature, or function. In the drawings:

FIG. 3 is a cross sectional view about line 2-2 schematic drawing of the antenna array illustrated in FIG. 2 with a signal distribution board, a beam former board and interconnects in accordance with exemplary aspects of the inventive concepts disclosed herein;

FIG. 4 is a cross sectional view schematic drawing of one of the interconnects illustrated in FIG. 3 in accordance with exemplary aspects of the inventive concepts disclosed herein;

FIG. 5 is a top planar view schematic drawing of a connection layer for the interconnect illustrated in FIG. 4 in accordance with exemplary aspects of the inventive concepts disclosed herein;

FIG. 6 is an exposed side planar view schematic drawing of one of the interconnects illustrated in FIG. 3 in accordance with exemplary aspects of the inventive concepts disclosed herein;

FIG. 7 is a top planar view schematic drawing of a connection layer for the interconnect illustrated in FIG. 6 in accordance with exemplary aspects of the inventive concepts disclosed herein.

DETAILED DESCRIPTION

Figures 1, 2:
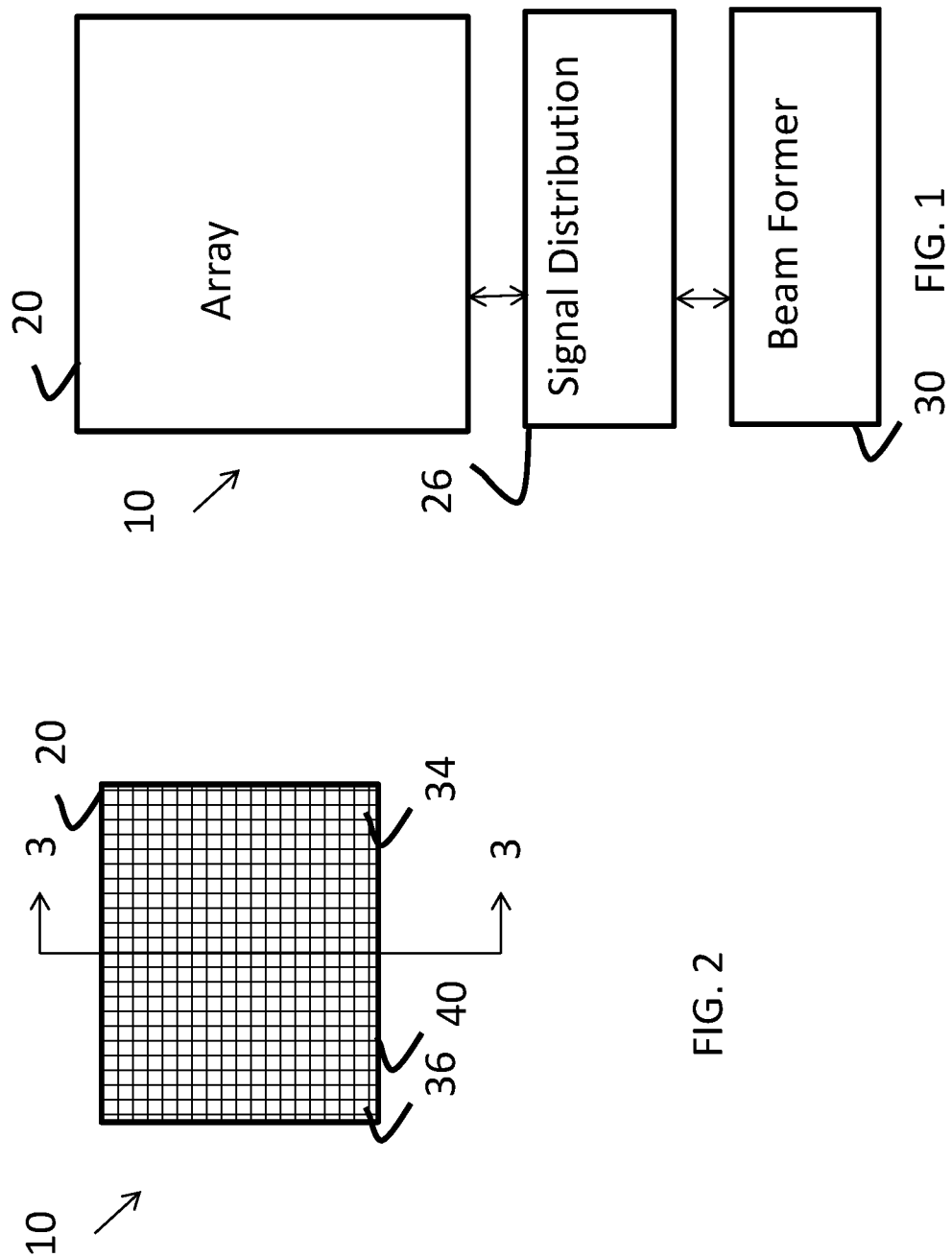
FIG. 1 is a general block diagram of an antenna system including an antenna array in accordance with exemplary aspects of the inventive concepts disclosed herein.
FIG. 2 is a top planar view schematic drawing of the antenna array illustrated in Figure in accordance with exemplary aspects of the inventive concepts disclosed herein.

Before describing in detail embodiments of the inventive concepts disclosed herein, it should be observed that the inventive concepts disclosed herein include, but are not limited to a novel structural combination of components and circuits disclosed herein, and not to the particular detailed configurations thereof. Accordingly, the structure, methods, functions, control and arrangement of components and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the diagrams provided in this disclosure, but should be construed in accordance with the language in the claims.

Some embodiments of the inventive concepts disclosed herein are directed to an aperture (e.g., a UUWB or UWB wavelength scaled array AESA aperture) that has connectorless interconnects that can significantly decrease component and manufacturing costs. Some embodiments of the inventive concepts disclosed herein are directed to an antenna system that has interconnects that do not rely upon edge mounted feed printed circuit cards perpendicularly mounted with respect to the antenna array and do not require egg crate assemblies which can increase manufacturing costs. In some embodiments, the interconnects provide spacing between a conducting ground plane and an antenna array to provide isolation which is especially advantageous at higher bandwidths. In some embodiments, circuit board fabrication technology is utilized to provide low cost, low weight, small interconnects.

Referring generally to the figures, antenna systems with an antenna arrays are shown and described that may be used in radar, sensor and communications systems according to certain embodiments. The antenna systems include a beam former used with electronically steerable antenna arrays. For example, the systems and methods described herein can be utilized in systems including but not limited to: military radar systems, weather radar systems, electronic intelligence (ELINT) receivers, electronic counter measure (ECM) systems, electronic support measure (ESM) systems, targeting systems or other communication systems. In one embodiment, the systems and methods are utilized to provide an ultra-wide band (UWB) or greater system.

With reference to FIGS. 1 and 2, an antenna system 10 includes an antenna array 20, a signal distribution network 26, and a beam former 30. The antenna array 20 is an AESA and includes a number of antenna elements 34 for sensing or communication applications. The antenna system 10 includes an interface to a transceiver which is a transmitter, receiver, or combination thereof. In some embodiments, the signal distribution network 26 is coupled to the array 20 via a connectorless interconnect, and the beam former 30 is coupled to the distribution network via another conectorless interconnect. The beam former 30 can be connected to the transceiver or components thereof using a backplane and connectors in some embodiments.

The antenna system 10 provides paths for signals provided to each of antenna elements 34 from the transceiver and/or from each of antenna elements 34 to the transceiver. The antenna system 10 provides appropriate filtering, combining, splitting, amplification, phase adjustment, and time delays for the signals associated with antenna elements 34 in some embodiments. In some embodiment, one or more of the filtering, combining, splitting, amplification, phase adjustment, and time delay operations is performed utilizing active combiners/splitters associated with one or more radio frequency integrated circuits (RFICs) in the beam former 30 and/or the signal distribution network 26.

The antenna system 10 can be part of a sensing system, radar system, and communication system in one embodiment. In one embodiment, system 10 can be part of an electronic intelligence (ELINT) receiver, an electronic countermeasure (ECM) system, an electronic support measure (ESM) system, and/or hybrids thereof. Antenna system 10 can be realized using parallel radio frequency integrated circuit subcircuits within the radio frequency integrated circuit in some embodiments.

The array 20 of the antenna elements 34 can be arranged as a one-dimensional or two-dimensional array of various sizes. The array 20 of antenna elements 34 can be a M×N array, where M and N are integers and where M represents the number of rows and N represents the number of columns in one embodiment. In one embodiment, M and N can be any combination of the following integers: 4, 8, 16, 32, 64, 128 and 256. In other embodiments, M and N can be different numbers (e.g., 0, 1, 2, 12, 24, etc.) without departing from the scope of the invention. The array 20 of antenna elements 34 can have various shapes including but not limited to: rectangular, square, circular (radial), triangular, elliptical, etc. The aperture can be one-dimensional, two-dimensional, linear, planar, cylindrical, spherical, or arbitrarily single or double curved surfaces in certain embodiments.

The antenna elements 34 can be any type of radiating element, dipole for receiving or transmitting radio frequency signals, or dipole pair. In some embodiments, the antenna elements 34 are conductive components or printed circuit board patterned elements on one or more layers of a circuit board 4. Antenna elements 34 can be patterned (or otherwise configured) and can be positioned for a particular polarization. For example, the antenna elements 34 can be configured for vertical polarization, horizontal polarization, circular polarization, elliptical polarization, etc. The antenna elements 34 are provided on a top surface 36 of a printed circuit board 40. In some embodiments, the circuit board 40 is a tiled circuit board configured from a number of circuit boards (e.g., multiple circuit boards tiled together to make a larger planar or curved structure) as described in U.S. Pat. No. 10,038,252 incorporated herein by reference in its entirety.

With reference to FIG. 3, the antenna system 10 includes the printed circuit board 40, one or more interconnect structures 52, a printed circuit board 45, one or more interconnects 62 and a printed circuit board 70. The array 20 is disposed on the printed circuit board 40. The top surface 36 of the circuit board 40 is for conductive patterns associated with the antenna elements 34 (FIG. 1).

The printed circuit board 40 is a monolithic circuit board including the antenna elements 34 provided on a conductive layer above a dielectric substrate in some embodiments. In some embodiments, the printed circuit board 40 includes two or more layers and the antenna elements 34 as well as other components are provided on the two or more layers. A bottom surface 38 of the printed circuit board 40 is opposite the top surface 36 and is coupled to one or more of the interconnects 52.

The circuit board 40 is an FR4, CEM, ceramic, G-10, flexible substrate, polyimide, etc. material including one or more layers of copper, aluminum or alloys thereof for conductive traces and contacts in some embodiments. The printed circuit boards 45 and 70 are similar to the circuit board 40, are monolithic or multilayer circuit boards, and can include one or more conductive layers combined with dielectric substrates or layers.

The circuit board 45 houses the distribution network 26 on one or more layers. A bottom surface 48 of the circuit board 45 is coupled to a top surface 71 of the circuit board 70 using one or more of the interconnects 62. The distribution network 26 provides circuit paths for connections from the beam former 26 to the array 20 via conductive traces on the circuit board 45.

The beam former 30 is provided on the circuit board 70. A bottom surface 73 of the circuit board 70 is opposite the top surface 71 of the circuit board 70. The top surface 71 of the circuit board 70 includes groups 74 of RFICs closest to interconnects 62 and groups 76 of RFICs between the groups 74 of RFICs. The groups 74 and 76 of the RFICS are configured to perform beam forming operations in some embodiments. The bottom surface 73 can include connectors for connecting to transceiver components in some embodiments.

The groups 74 and 76 of the RFICs can be a silicon germanium, gallium arsenide, indium phosphate, or a complementary metal oxide semiconductor integrated circuit configured for radio frequency operation. Various active circuits can be provided on the integrated circuit including but not limited to: power amplifiers, low noise amplifiers, variable power amplifiers, and phase shifters, transmit/receive switches, temperature sensing equipment, radio frequency (RF) power and phase delay sensing components, time delay units, digital control, interfaces, etc. in one embodiment. In some embodiments, the groups 74 and 76 of the RFICS or the circuit boards 45 and 70 include active or passive splitters/combiners. The term splitter/combiner as used herein refers to a splitter/combiner, a combiner or a combination splitter and combiner.

The interconnects 52 are coupled to a top surface 44 of the circuit board 45 by connections 54 and to a bottom surface 38 of the circuit board 40 by connections 56. The connections 54 and 56 are solder connections such as ball grid array connections in some embodiments. The connections 54 and 56 can be flip chip, ball grid array, or sub-linking connections. Advantageously, the interconnects 52 exploit printed board circuit board technology to reduce cost and provide no touch labor for assembling antenna system 10 in some embodiments. In some embodiments, the interconnects 52 connect the circuit board 40 to the circuit board 45 without the use of connectors.

The interconnects 52 are manufactured from one or more layers of circuit board materials in some embodiments. Each layer height or thickness is selected in accordance with application parameters and design criteria for the antenna system 10. The height of the feeds associated with interconnects 52 is customizable by printed circuit board height for covering required bands and extending the band width of the array 20. Accordingly, the use of interconnects 52 as the feeds can provide a frequency scalable solution in some embodiments.

In some embodiments, each antenna element 34 (FIG. 1) is associated with one interconnect 52 serving as a printed circuit board feed. The interconnects 52 are arranged as a matrix of M by N interconnects matching the array 20 in some embodiments. In some embodiments, each interconnect 52 is coupled to a set of the antenna elements 34. The interconnects 52 can provide any number of node connections between the circuit board 40 and 45. The connections 54 and 56 can include 2, 4, 6, 8 or any number of connections.

The interconnects 62 are coupled to the bottom surface 48 of the circuit board 45 by connections 66 and to the top surface 71 of the circuit board 70 by connections 64. The connections 66 and 64 can be similar to the connections 54 and 56. The interconnects 62 are similar to the interconnects 52 in some embodiments. The interconnects 62 can include a monolithic or a multi-layer circuit board 82 and a monolithic or multi-layer circuit board 84 coupled together via a connection layer 63 which can be similar to the connection layers discussed for interconnects 52 below.

With reference to FIG. 4, an interconnect 52a includes a printed circuit board 102 and a printed circuit board 104 connected by a connection layer 106. The interconnect 52a can be used as the interconnect 52 in FIG. 3. Vias 110 are utilized to provide connections between or across the interconnect 52a (e.g., between the circuit boards 102 and 104 to connect to the connections 54 and 56 in FIG. 3). The interconnect 52a is for applications with an instantaneous bandwidth greater than 6 to 1 in some embodiments.

The layers or circuit boards 102 and 104 are any suitable dielectric material such as FR-4 material and conductive laminate. The circuit boards 102 and 104 have a dielectric material with a 3.5 to 3.7 dielectric constant and a $D_f$ of 0.006 to 0.071 in some embodiments. Holes for the vias 110 are drilled using a diameter of 24 mils to 52 mils in some embodiments. Contact pads for the vias 110 can be provided as 52 mil diameter pads in some embodiments. The gap between neighboring vias 110 is selected for 100 Ohm differential impedance in some embodiments.

The vias 110 include a via portion 112 extending across the circuit board 102 and a via portion 114 extending across the circuit board 104. The via portions 112 and 114 are connected by the connection layer 106 between the circuit boards 102 and 104 and have a circular cross section in some embodiments. The via portions 112 and 114 have aspect ratios associated with circuit board fabrication techniques (e.g., each have aspect ratios from 4 to 1 to 8 to 1) in some embodiments. The vias 110 have aspect ratios greater than 8 to 1 (e.g., greater than 10 to 1, 12 to 1, 16 to 1, etc.). The high aspect ratios associated with the vias 110 advantageously allow a compact interconnect structure for the interconnects 52 in some embodiments. The desired aspect ratio can be chosen based upon hole size and board thickness in some embodiments.

In some embodiments, the interconnect 52a includes additional circuits boards (3, 4, or more). Vias similar to vias 110 for the additional circuit board configurations include via portions connected by a connection layer and having aspect ratios of 4 to 1 to 8 to 1 and the total aspect ratio for the via through all of the circuit boards is greater than 16 to 1 (e.g., 24 to 1, 32 to 1, etc.). In some embodiments, the interconnect 52 is a monolithic printed circuit board feed structure.

With reference to FIG. 5, the connection layer 106 includes a pattern of circular conductive regions 112. The pattern is a matrix arrangement where spaces between conductive regions 112 and sizes of regions 112 are arranged to prevent shorting between the vias 110. The arrangement allows four conductive regions 112 (e.g., for redundancy) to connect to each conductive via 110 in some embodiments. In some embodiments, the pattern is a reoccurring diamond pattern, square pattern, circular pattern, a checker board pattern, etc. In some embodiments, the conductive regions 112 are circular, diamonds, squares, rectangles, pentagons, etc.

In some embodiments, the conductive regions 112 are ball grid arrays disposed on a surface 118, a surface 120, or both of the surfaces 118 and 120 of the interconnect 52a (FIG. 4). Printed circuit board techniques including contact formation and ball grid array formation can be used to form the conductive regions 112. The layers or circuit boards 102 and 104 can be combined in a pick and place manufacturing operation.

With reference to FIG. 6, an interconnect 52b includes a layer or printed circuit board 124 and a layer or printed circuit board 126 connected by a connection layer 132. The interconnect 52b is similar to the interconnect 52a (FIG. 4) and can be used as the interconnect 52 in FIG. 3. The circuit board 126 and the circuit board 124 are similar to the circuit boards circuit board 102 and 104. The circuit boards 124 and 126 each include a 93 mil layer of 370HR, IS-620i, or Isola I-speed laminate dielectric material and a layer of 370HR, IS-620i, or Isola I-speed prepreg material of varying thickness depending on design parameters.

The interconnect 52b includes conductive vias 130 including a via portion 144 and a via portion 146 coupled together by the connection layer 132 embodied as a sublinked PCB connection layer 132. The via portions 114 and 116 have aspect ratios associated with circuit board fabrication techniques (e.g., each have aspect ratios from 4 to 1 to 8 to 1) in some embodiments. The vias 130 have aspect ratios greater than 8 to 1 (e.g., greater than 10 to 1, 12 to 1, 16 to 1, etc.). The high aspect ratios associated with the vias 130 advantageously allow a compact interconnect structure for the interconnects 52 in some embodiments. The via portion 144 is coupled to a contact 140 for the connection 56 (FIG. 3) and the via portion 146 is coupled to a contact 141 for the connection 54 (FIG. 3) in some embodiments.

With reference to FIG. 7, the connection layer 132 is comprised of a Zeta prepreg layer 151 (e.g., 3.5-4.0 mils thick) including holes containing ormet conductive regions 150. The conductive material for the conductive regions 150 of the prepreg layer 151 can be squeegeed into the holes. The layer 151 is adhered to the circuit boards 124 and 126 with an adhesive. In some embodiments, the vias 130 are formed by a mechanical drill (e.g., 24 mil in diameter to 52 mil in diameter), filled, and connected to a 52 millimeter diameter pad.

The conductive regions 150 are provided in a pattern 153 include a diamond section 155. The pattern is a matrix arrangement where spaces between conductive regions 150 and sizes of regions 150 are arranged to prevent shorting between the vias 130. The layers or circuit boards 124 and 126 can be combined in a pick and place manufacturing operation, and the layer 132 makes placement/alignment easier in final assembly.

The interconnect 52b can meet a wide band width configuration with excess of 6 to 1 instantaneous band width and can have a scalable thickness to meet different band widths. Adjusting a gap between the drill holes for the conductive vias 130 can meet a 100 ohm differential impedance. A desired aspect ratio can be achieved by choosing drill diameter versus thickness for appropriate dimensions for the interconnect 52b.

Figure 8:
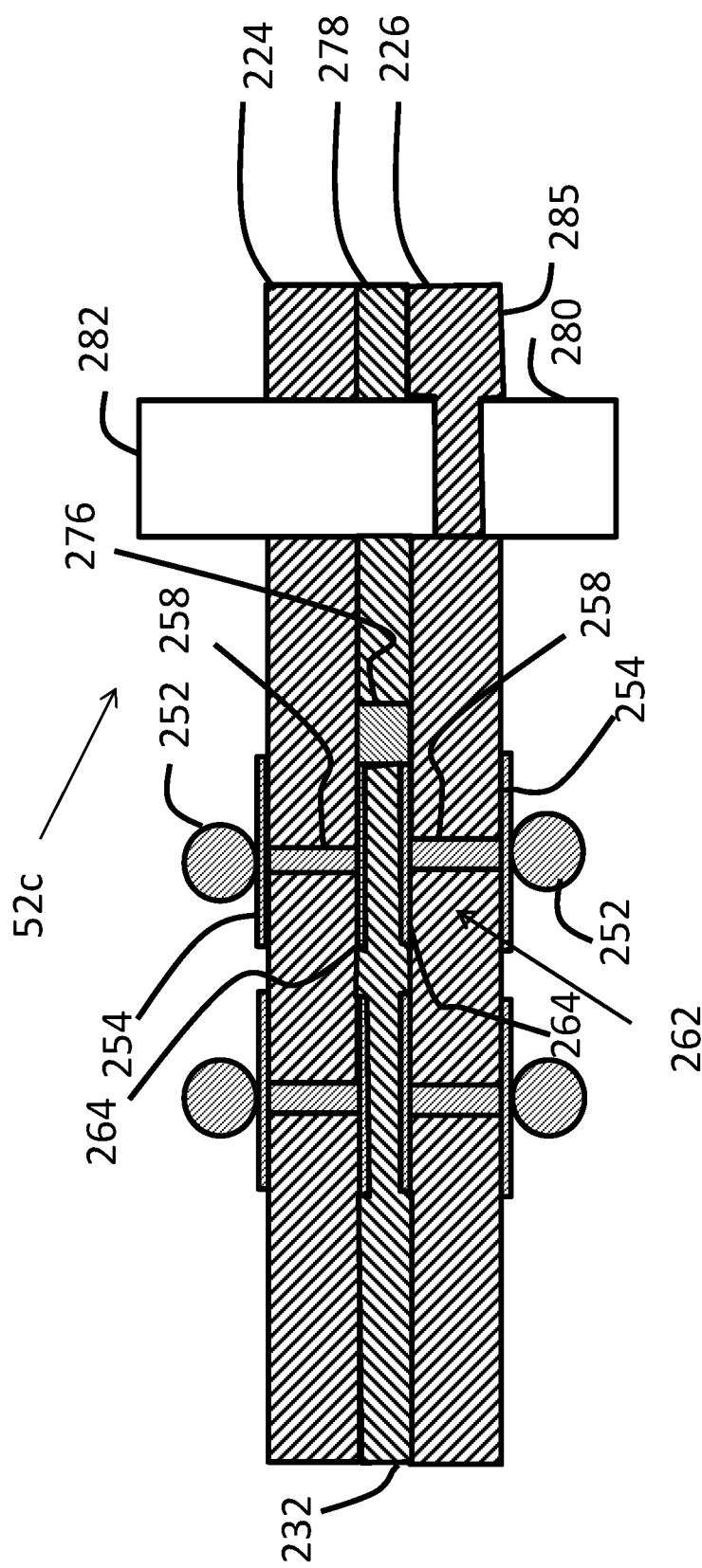
FIG. 8 is a cross sectional view schematic drawing of one of the interconnects illustrated in FIG. 2 in accordance with exemplary aspects of the inventive concepts disclosed herein.

With reference to FIG. 8, an interconnect 25c includes a layer or printed circuit board 224 and a layer or printed circuit board 226 connected by a connection layer 232. The interconnect 52c is similar to the interconnects 52a (FIG. 4) and 52b (FIG. 6) and can be used as the interconnect 52 in FIG. 3. The interconnect 52c includes ball grid array connections or ball grid array structures 252 on pads 254 for the connections 54 and 56 (FIG. 3). The pads 254 are coupled to via portions 258 which make up a via 262.

The via portions 258 are coupled to the pads 264. The pads 264 are coupled together by a conductive member 276. The conductive member 276 is provided in a hole in a sublink interconnect layer 278. PCB profiles 280 and 282 (e.g., cut-outs) are shown and the distance between PCB profiles 280 and 282 can be approximately 0.03 inches. The PCB profile 280 can extend from a bottom surface 285 to approximately 0.03 inches into the board 285 while the PC board profile 282 can extend through the layer or circuit board 224 and layer 278 and into circuit board 226. The profiles 280 and 282 provide a lower effective dielectric constant for the circuit board 232, thereby allowing larger scan volumes of the antenna array 20. Via portion 258 and the conductive portion 276 are for electrical continuity of the RF signal.

The number of radiating elements (e.g., elements 34), the number of beam channels, etc. are described herein as exemplary embodiments and not in a limiting fashion. Other numbers of radiating elements (e.g., elements 34), beam channels, etc., can be utilized. Further, the number of layers shown and the specific materials and thicknesses listed are exemplary only. Depending on desired spacing and thicknesses, the interconnect structures 52 can include two, three, four or more circuit boards or layers and additional connection layers there between. Simulations indicate that the voltage standing wave ratio is relatively constant across frequency for a variety of materials used in the interconnects 52.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

What is claimed is:

1. A circuit board interconnect system for an array antenna, the array antenna disposed on a first printed circuit board having printed circuit board antenna elements, the circuit board interconnect system comprising:
 a first printed circuit board having an array of printed circuit board antenna elements;
 a second circuit board having a signal distribution network for the antenna elements; and
 at least one first interconnect structure coupled between a bottom surface of the first printed circuit board and a top surface of the second circuit board, wherein the first interconnect structure includes first vias having an aspect ratio of greater than 10 to 1, wherein the first vias electrically connect to respective first contacts on the bottom surface of the first printed circuit board and to respective second contacts on the top surface of the second circuit board.

2. The system of claim 1, wherein the aspect ratio is at least 16 to 1.

3. The system of claim 2, further comprising:
 a third circuit board having a beam former circuit; and
 at least one second interconnect structure coupled between a bottom surface of the second circuit board and a top surface of the third circuit board, wherein the second interconnect structure includes second vias having an aspect ratio of greater than 10 to 1, wherein the second vias electrically connect to respective third contacts on the bottom surface of the second circuit board and to respective fourth contacts on the top surface of the third circuit board.

4. The system of claim 1, wherein the first interconnect structure comprises a first layer, a second layer, and a connection layer between the first layer and the second layer, wherein the first vias are each comprised of a first portion in the first layer and a second portion in the second layer and are connected by the connection layer.

5. The system of claim 4, wherein the connection layer comprises a pattern of conductive material.

6. The system of claim 5, wherein the pattern is a checkerboard pattern.

7. The system of claim 1, wherein differential impedance between a pair of the first vias is 100 Ohms or more.

8. The system of claim 1, wherein the first interconnect structure is connectorless.

9. The system of claim 1, wherein the at least one first interconnect structure is electrically coupled between the bottom surface of the first printed circuit board and the top surface of the second circuit board using solder.

10. A method of assembling an antenna system, the method comprising:
 providing a first printed circuit board having an array of printed circuit board antenna elements;
 providing a second circuit board having a signal distribution network for the antenna elements;
 providing at least one first interconnect structure having first contacts on a first planar top surface and second contacts on a second planar first bottom surface;
 coupling the first contacts to a bottom surface of the first printed circuit board; and
 coupling the second contacts to a top surface of the second circuit board, wherein vias electrically connect the first contacts and the second contacts, wherein the vias have an aspect ratio of greater than 10 to 1.

11. The method of claim 10, wherein the array is an ultra-wide band array.

12. The method of claim 10, wherein the printed circuit board antenna elements are each associated with a respective interconnect structure.

13. The method of claim 10, further comprising:
 providing a first profile through the first circuit board layer of an interconnect structure; and
 providing a second profile from a bottom surface of the second circuit board layer of the interconnect structure, wherein the first profile and the second profile are 0.03 inches apart and lower the effective dielectric constant for the first circuit board layer and the second circuit board layer, thereby allowing larger scan volumes of the array.

14. The method of claim 10, further comprising:
 providing a third circuit board having a beam former circuit; and
 providing at least one second interconnect structure coupled between a bottom surface of the second circuit board and a top surface of the third circuit board, wherein the second interconnect structure comprises second vias having an aspect ratio of greater than 10 to 1, wherein the second vias electrically connect to respective third contacts on the bottom surface of the second circuit board and to respective fourth contacts on the top surface of the third circuit board.

15. An antenna system, comprising:
 a first printed circuit board having an array of printed circuit board antenna elements disposed on a first planar top surface;
 a second circuit board having a second planar top surface disposed in parallel with the first planar top surface; and
 at least one first interconnect feed structure coupled between a first bottom surface of the first printed circuit board and the second planar top surface of the second circuit board, wherein the first interconnect structure includes a first circuit board layer and as second circuit board layer, wherein the first interconnect structure comprises first contacts disposed on a third planar top surface and second contacts disposed on a third planar bottom surface, wherein the first contacts are electrically connected to the first bottom surface and the second contacts are electrically connected to the second planar top surface, and vias disposed between the third planar top surface and the third planar bottom surface connect the first contacts and the second contacts, wherein the first interconnect feed structure comprises a connective layer, wherein a first via portion extends through the first circuit board layer and a second via portion extends through the second circuit board layer, wherein the first via portion is connected to the second via portion between the first circuit board layer and the second circuit board layer by the connective layer.

16. The antenna system of claim 15, further comprising:
a third circuit board having a beam former circuit; and
at least one second interconnect structure coupled a second planar bottom surface of the second circuit board and a fourth planar top surface of the third circuit board.

17. The antenna system of claim 15, wherein the vias have an aspect ratio of greater than 10 to 1.

18. The antenna system of claim 15, wherein the vias have an aspect ratio equal to or greater than 16 to 1.

* * * * *